United States Patent [19]

Cohen

[11] Patent Number: 5,019,791

[45] Date of Patent: May 28, 1991

[54] MILLIMETER WAVE OSCILLATOR WITH FLICKER (1/F) NOISE SUPPRESSION

[75] Inventor: Leonard D. Cohen, Brooklyn, N.Y.

[73] Assignee: AIL Systems, Inc., Deer Park, N.Y.

[21] Appl. No.: 563,246

[22] Filed: Aug. 6, 1990

[51] Int. Cl.⁵ .......................... H03B 7/00; H03B 7/06; H03L 1/00

[52] U.S. Cl. ................................ 331/96; 331/107 R; 331/107 G; 331/175; 331/177 V

[58] Field of Search ............. 331/96, 107 R, 107 DP, 331/107 G, 117 D, 132, 175, 177 V

[56] References Cited

U.S. PATENT DOCUMENTS

| | | | |
|---|---|---|---|
| 4,097,829 | 6/1978 | Cohen | 331/107 G X |
| 4,246,550 | 1/1981 | Cohen | 331/107 DP |
| 4,728,907 | 3/1988 | Cohen | 331/107 R |
| 4,906,947 | 3/1990 | Hart et al. | 331/107 G X |

OTHER PUBLICATIONS

"Noise in Oscillators", W. A. Edson, *Proc. IRE*, vol. 48, No. 8, 1960 pp. 1454–1466.
"How to Build a Gunn Oscillator", A Sweet, *Microwave Associates Micronotes*, vol. 11, #2, Mar. 1974.
"FM and AM Noise in Microwave Oscillators", S. Hamilton *Microwave Journal*, Jun. 1978, pp. 105–109.
"Varactor Tuned Gunn Oscillators with Wide Tuning Range for the 25 to 75 GHz Frequency Band", Leonard D. Cohen, 1979 *IEEE-MTT-S International Microwave Symposium Digest*, Apr. 1979, pp. 177–179, Orlando, Forida.
"Solid State Microwave VCO's", *Frequency Sources Application Note*, 1980.
*Frequency Synthesizers-Theory & Design*, V. Manassewitsch, John Wiley & Sons, N.Y., 2nd Edition, 1980.
"Semi-Active Radar Guidance", A. Ivanov, *Microwave Journal*, Sep. 1983, pp. 105–120.
"Millimeter Wave Oscillators and Impatt Power Supplied", Plessey Microwave Electronics, Product Catalog #6116, May 1984.
"Phase Noise Characterization of Microwave Oscillators", *HP Product Note* 11729C-2, Sep. 1985.
"Recent Advances in the Modelling and Performance of Millimeter Wave InP and GaAs VCO's and Oscillators", L. D. Cohen and E. Sard, 1987, *IEEE-MTT-S International Microwave Symposium Digest*, pp. 429–432.

Primary Examiner—David Mis
Attorney, Agent, or Firm—Andrus, Sceales, Starke & Sawall

[57] ABSTRACT

Flicker (1/f) noise is suppressed in an oscillator by reducing oscillator voltage-frequency pushing to zero. A varactor (56) is incorporated in the resonator circuit and is biased with a tuning voltage setting the varactor to a capacitance value providing the zero oscillator pushing at a given frequency. A common bias connection (62) is provided between the varactor and the active element (64) such that a random perturbation voltage change across the active element also causes a change in voltage across the varactor, to compensate a change in oscillator frequency otherwise caused thereby. The varactor capacitance versus voltage characteristic is shaped such that a change in active element voltage provides a change in varactor voltage, and the combination of these voltage changes results in a zero change in oscillator frequency. The tuning slope of the oscillator provided by the varactor is opposite the tuning slope of the oscillator resulting from a change in active element voltage.

30 Claims, 4 Drawing Sheets

FIG. 1 CALCULATED PHASE NOISE $S_\phi(f_m)$ OF A GUNN OSCILLATOR
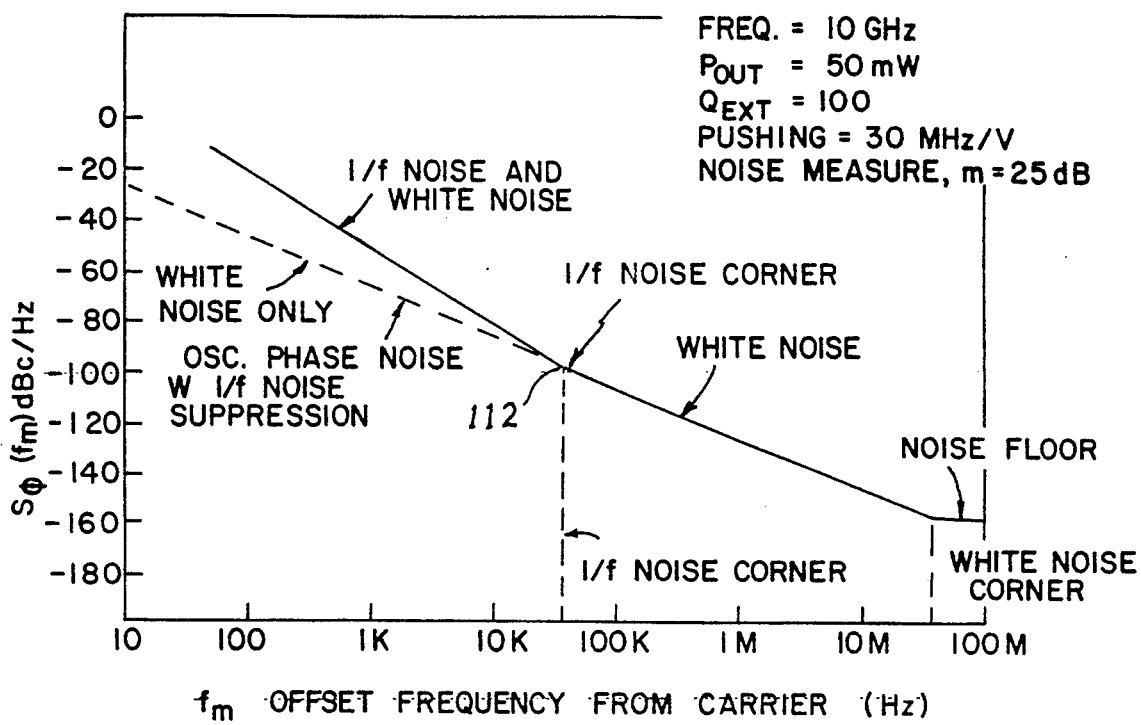
FIG. 12 PHASE NOISE $S_\phi(f_m)$ OF A GUNN OSCILLATOR
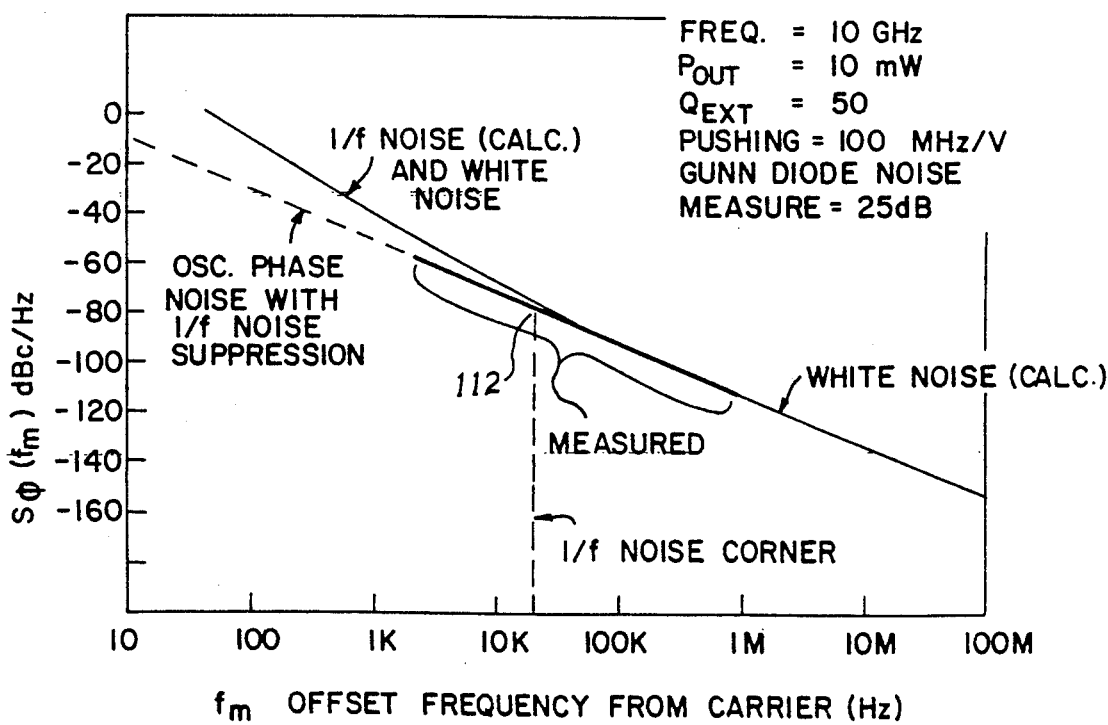

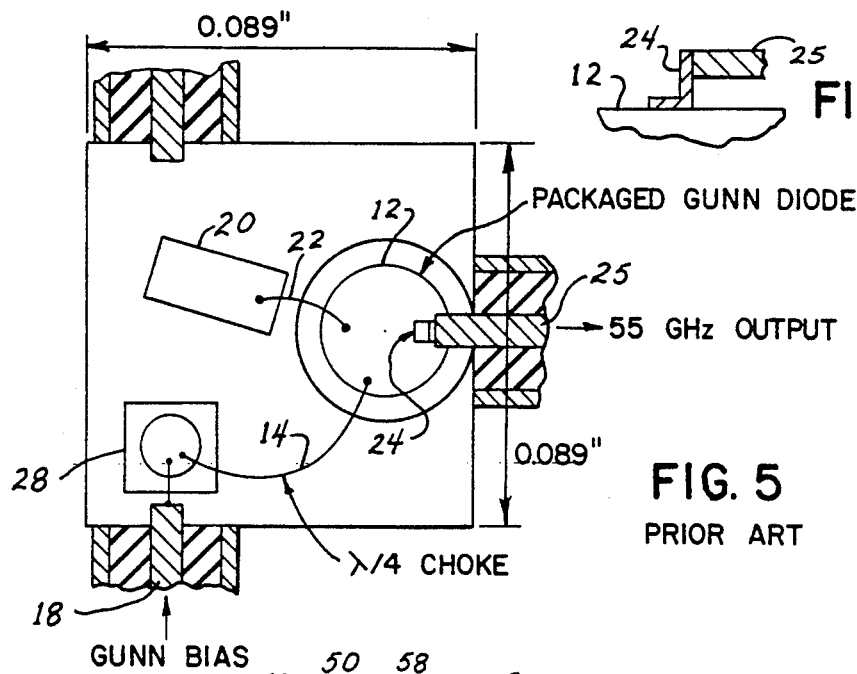
FIG. 6
FIG. 5 PRIOR ART
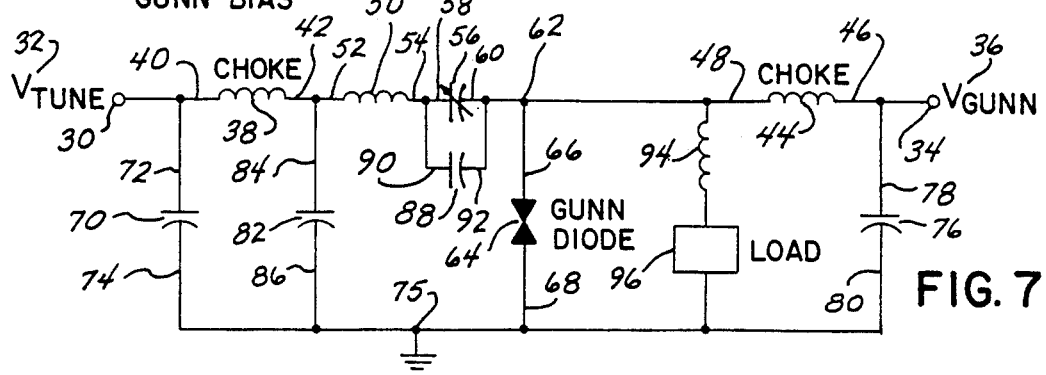
FIG. 7
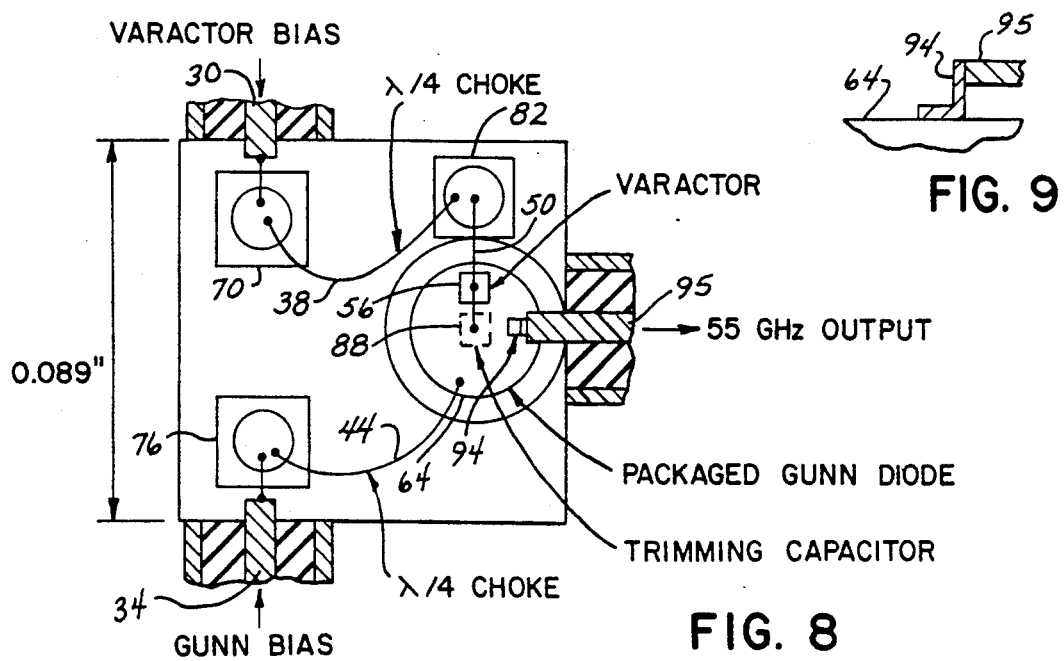
FIG. 9
FIG. 8

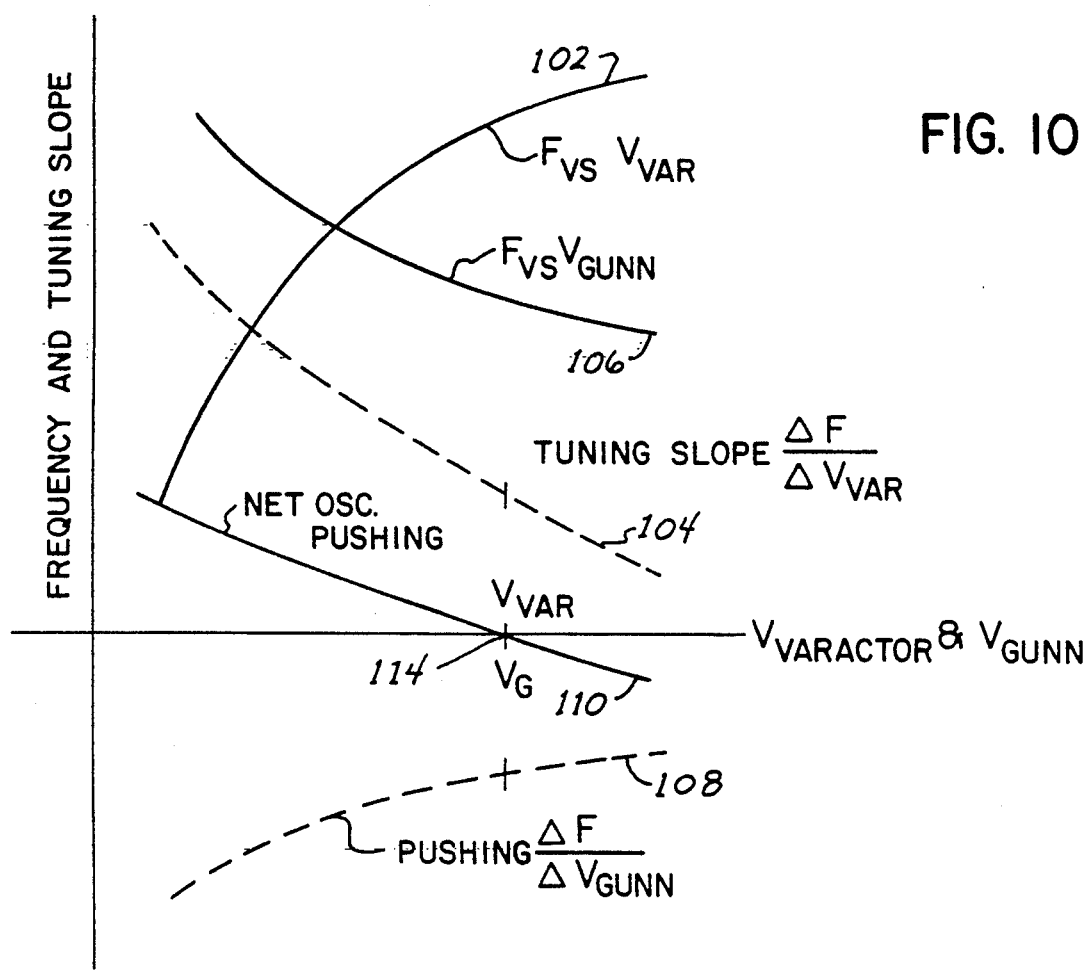
FIG. 10
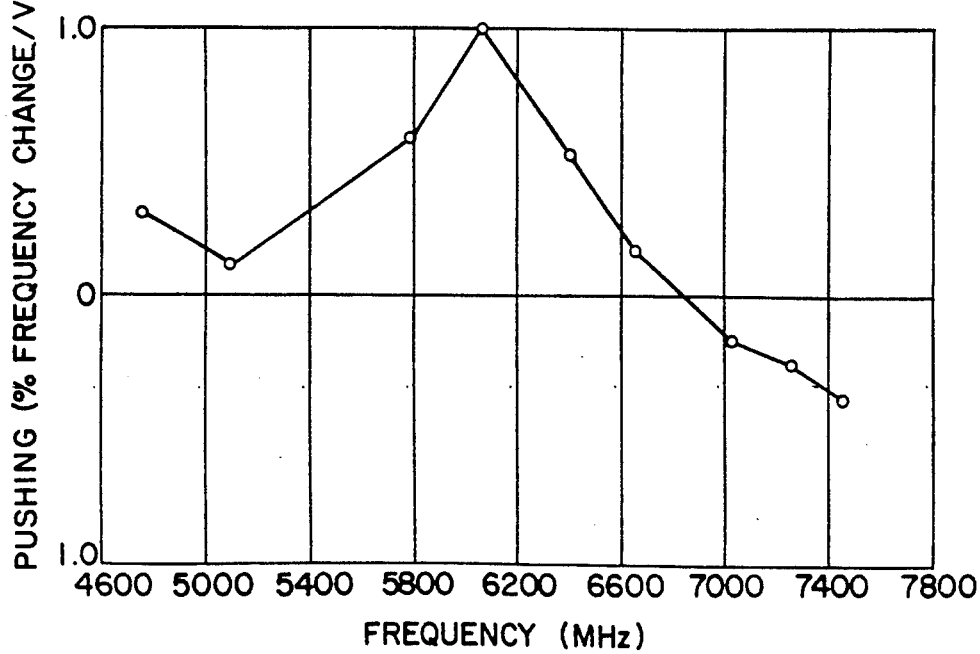
FIG. 11 VCO PUSHING VS. FREQUENCY

MILLIMETER WAVE OSCILLATOR WITH FLICKER (1/F) NOISE SUPPRESSION

BACKGROUND AND SUMMARY

The invention relates to oscillators operational in the millimeter wave and microwave range, and more particularly to suppression of flicker (1/f) noise.

Phase noise on signal sources used as transmitters and receiver local oscillators in communication and radar systems can cause a degradation in system sensitivity and selectivity. In a digital communication system, for example, phase noise close to the carrier affects the system bit-error rate. In a Doppler radar system, phase noise on both the transmitter and local oscillator sources set a detection limit on Doppler shifted target returns in the presence of a larger clutter return signal that is close in frequency to the target return. Sources with low phase noise at millimeter wavelengths are of interest to various applications where a significant clutter signal is normally present, "Semi-Active Radar Guidance", A. Ivanov, *Microwave Journal*, Sept. 1983, pp. 105–120. A basic oscillator or VCO source must generally incorporate a noise reduction technique (e.g. phase locking, filtering) to meet typical system requirements on phase noise close to the carrier.

The present invention provides a unique and simple circuit addition integral to an oscillator or VCO source that functions to suppress the generation of output flicker (1/f) noise, the major contributor to phase noise at frequencies close to the carrier. Although the phase noise suppression method is applicable to a variety of source types (e.g. Gunn, Impatt, FET, Bipolar transistor), the subsequent discussion will describe the circuit technique as applied to a Gunn oscillator. It can be used with active devices other than a Gunn diode wherewith oscillator frequency pushing is a significant controller of 1/f noise in the output spectrum.

BRIEF DESCRIPTION OF THE DRAWINGS

FIG. 1 is a graph showing phase noise versus offset frequency.

FIG. 5 shows the physical layout of the circuitry of FIG. 4.

FIG. 6 is a side view of a portion of the structure of FIG. 5.

FIG. 7 is a circuit diagram showing an oscillator constructed in accordance with the invention.

FIG. 8 shows the physical layout of the circuitry of FIG. 7.

FIG. 9 is a side view of a portion of the structure of FIG. 8.

FIG. 10 is a graph showing frequency versus voltage and illustrates zero oscillator pushing.

FIG. 11 is a graph showing pushing versus frequency.

FIG. 12 is a graph like FIG. 1 and shows measured data.

DETAILED DESCRIPTION

Introduction

Figure 2:
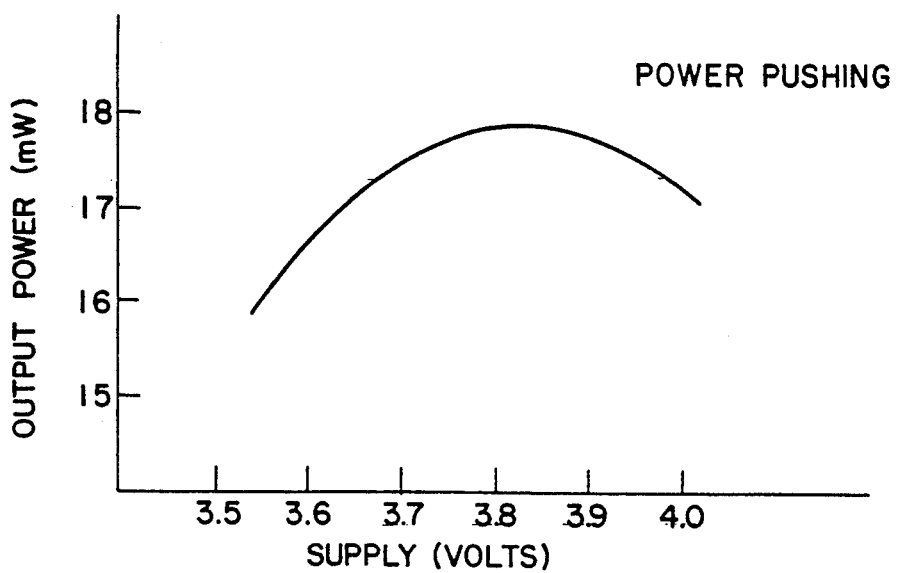
FIG. 2 is a graph showing power pushing.

The random fluctuations in the frequency or phase of the output of an oscillator or voltage controlled oscillator (VCO) is known as its frequency (FM) or phase (PM) noise. The interface of semiconductor material to metallization is not perfect, and there are many points of contact which randomly vary the current flow pattern each time current flows. The noise is usually specified as a frequency or phase deviation of a carrier in a reference bandwidth (e.g. 1 Hz) at a specified frequency from the carrier. For example, assume an oscillator has its FM noise specified as a 0.15 Hz deviation referenced to a 1 Hz bandwidth at a 100 Hz frequency offset from a 10 GHz carrier. This means that the noise power of the oscillator in a 1 Hz bandwidth is the same power that would be measured in one sideband if a noiseless oscillator with the same output power was frequency modulated at a 100 Hz rate with a carrier deviation of 0.15 Hz. Phase or frequency deviation can be discussed interchangeably since the two are related by the rate of modulation. Phase deviation ($\theta$) is equal to frequency deviation ($\Delta f$) divided by the modulation rate ($f_m$), $$\theta = \frac{\Delta f}{f_m}. \tag{1}$$

The character of the phase or frequency noise of a Gunn oscillator has been analyzed and reported in the literature: "How to Build a Gunn Oscillator", A. Sweet, *Microwave Associates Micronotes*, Vol. 11, #2, March 1974; "FM and AM Noise in Microwave Oscillators", S. Hamilton, Microwave Journal, June 1978, pp. 105–109; "Solid State Microwave VCO's", *Frequency Sources Application Note*, 1980. As noted in Sweet and Hamilton, Gunn oscillator FM (or phase) noise can be characterized as a low frequency flicker (1/f) noise which is predominant at frequencies close to the carrier, and a white noise which is predominant at frequencies far from the carrier. In the intermediate frequency region, both types of noise are present. The low frequency 1/f noise is upconverted by the dynamic capacitance and negative differential resistivity of the Gunn diode. It is known that the resulting FM noise is directly proportional to the voltage (frequency) pushing of the oscillator. The white noise component behaves in the manner described in "Noise in Oscillators", W.A. Edson, Proc. IRE, Vol. 48, No. 8, 1960, pp. 1454–1466. The noise floor of the oscillator is determined by the noise temperature or noise measure of an oscillator. The character of the noise spectrum of a Gunn oscillator is illustrated by the solid curve in FIG. 1. The dotted portion of the phase noise curve shows the reduced oscillator phase noise in the 1/f noise region afforded by the present invention. The phase noise reduction shown is 10 dB/decade.

A commonly used measure of phase noise, "Phase Noise Characterization of Microwave Oscillators", HP Product Note 11729C-2, Sept. 1985, is the spectral density of phase fluctuations, $S_{100}(f_m)$, which is related to the spectral density of frequency fluctuations, $S_\Delta(f_m)$, by $$S_\phi(f_m) = \frac{\Delta \phi^2_{rms}(f_m)}{BW \text{ measurement}} \quad \frac{\text{radians}^2}{H_z} \tag{2}$$

$$= \frac{S_\Delta(f_m)}{f_m^2} \tag{3}$$

where $\Delta\phi$ is the phase deviation. The term $S_{\Delta f}(f_m)$ is the spectral density of frequency fluctuations, a measure of FM noise, and is related to frequency deviation $\Delta f$ by $$S_{\Delta f}(f_m) = \frac{\Delta f_{rms}^2}{BW \text{ measurement}} \frac{H_z^2}{H_z}. \quad (4)$$

The spectral density of phase fluctuations, $S_\phi(f_m)$, or frequency fluctuations, $S_{\Delta f}(f_m)$, is related to the commonly used noise to carrier ratio, $L(f_m)$ in dBc/Hz by $$L(f_m) = \frac{P_{noise}}{P_{carrier}} \text{ per } H_z = \frac{S_{\Delta\phi}(f_m)}{2} \quad (5)$$

and $$L(f_m) = \frac{S_{\Delta f}(f_m)}{2 f_m^2}. \quad (6)$$

The use of $L(f_m)$ as a valid noise measure necessitates that higher order modulation sidebands of the phase modulation be insignificant compared to the power in the first order sideband. The criteria is satisfied if the peak phase deviation is less than 0.2 radians. In the region of 1/f noise where the peak phase deviation can exceed 0.2 radians, $L(f_m)$ would be an invalid measure and $S\phi(f_m)$ must be used to represent the phase noise of the oscillator.

Theory and experiment reported in the literature have shown that the voltage pushing of an oscillator is the controlling factor in 1/f noise generation, "How to Build a Gunn Oscillator", A. Sweet, *Microwave Associates Micronotes*, Vol. 11, #2, March 1974. An expression for the FM noise of a Gunn oscillator is given by $$\Delta f_{rms} = \sqrt{\frac{f_o^2 K T_N B}{Q_L^2 P_c} + \frac{\left(\frac{\delta f}{\delta V_o}\right)^2 N}{f_m^\alpha}} \quad (7)$$

where $\Delta f_{rms}$ is the RMS frequency deviation in Hz,
$f_o$ is the carrier center frequency in Hz,
$Q_l$ is the resonator loaded Q,
$P_c$ is carrier power in watts,
$\delta f/\delta V_o$ is oscillator voltage pushing in Hz/Volt,
$f_m$ is the frequency from the carrier where the noise is measured, normalized to 1 Hz,
$T_W$ is a noise temperature which is characteristic of thermal noise intensity.

The range of $KT_H B$ for CW Gunn diodes is roughly $1.0$–$1.5 \times 10^{16}$ watts in a 1 KHz bandwidth. The parameter N characterizes the intensity of the excess noise, while $\alpha$ is characteristic of the spectrum's shape. N ranges from $1.0 \times 10^{-8}$ volts$^2$ to $1.5 \times 10^{-7}$ volts$^2$ in a 1 kHz bandwidth, and $\alpha$ is a number between 0.60 and 1.20, which is obtained from low frequency flicker noise measurements. white (thermal) noise, and the term on the right is the flicker (1/f) noise. The term $(\delta f/\delta V_o)$ in the numerator on the right is the change in frequency with voltage, i.e. oscillator pushing.

The FM noise of the Gunn oscillator described in equation 7 can be expressed as a phase noise, $S_\phi$ (fm), by the expression $$S_\phi(f_m) = \frac{f_o^2 K T_N B}{Q_L^2 P_c f_m^2} + \frac{\left(\frac{\delta f}{\delta V_o}\right)^2 N}{f_m^3} \quad (\alpha = 1). \quad (8)$$

The calculated Gunn oscillator phase noise shown plotted in FIG. 1 was obtained by use of equation 8. The noise floor of the oscillator is shown as $-159$ dBc/Hz and is based on a noise measure of 25 dB for the Gunn diode, "FM and AM Noise in Microwave Oscillators", S. Hamilton, *Microwave Journal*, June 1978, pp. 105–109. The phase noise spectrum exhibits a 9 dB/octave slope with offset frequency, fm, in the 1/f region and a 6 dB/octave slope in the white noise region. Hence, 1/f noise contributes an additional 3 dB/octave (10 dB/decade) of noise above the white noise to the oscillator output. The present invention suppresses the flicker (1/f) noise contribution and decreases the phase noise of the oscillator (or VCO) by 10 dB/decade in the 1/f region close to the carrier. Suppression of the 1/f noise is accomplished by making the oscillator voltage frequency pushing equal to zero, a result predicted from equations 7 or 8. Pushing of an oscillator is known as the change in output frequency with oscillator bias voltage. Flicker noise results from fluctuations in Gunn diode domain capacitance by random fluctuations in voltage across its active region, which in turn results in random phase or frequency fluctuations in oscillator output, "How to Build a Gunn Oscillator", A. Sweet, Microwave Associates Micronotes, Vol. 11, #2, March 1974.

Prior Art

Significant reduction in the 1/f noise of some devices has been made by circuit means, *Frequency Synthesizers-Theory & Design*, V. Manassewitsch, John Wiley & Sons, N.Y. 2nd Edition, 1980. When negative feedback was utilized in amplifiers and multipliers, more than a 30 dB reduction of flicker phase noise was achievable. The feedback method for flicker phase noise reduction is effective at low frequencies. At microwave and millimeter wave frequencies, this method is of questionable effectiveness due to the large (multiwave) path length of the feedback circuit relative to a wavelength of oscillator frequency. The 1/f noise suppression method of the present invention is especially suitable at microwave and millimeter wavelengths since the suppression circuit is an integral part of the oscillator circuit used and path lengths are nominally one tenth wavelength at oscillator frequency. The oscillator is built in lumped element circuit form. For further background regarding lumped element circuit form, reference is made to "Recent Advances in the Modelling and Performance of Millimeter Wave InP and GaAs VCO's and Oscillators", L.D. Cohen & E. Sard, 1987 IEEE-MTT-S International Microwave Symposium Digest, pp. 429–432. The entire oscillator circuit, including the 1/f noise suppression circuit, is assembled in a 3/32 by 3/32 inch area for a 55 GHz Gunn oscillator.

Phase noise reduction in the 1/f region of an oscillator has also been achieved by phase locking the oscillator to a low phase noise reference source. Compared to the present 1/f noise suppression method, the phase locking method is significantly more complex, larger and more costly and power consuming (watts). In the present invention, the 1/f noise suppression circuit is an integral part of the oscillator circuit, is miniature in size and is passive (no dc input power). It is possible to achieve 1/f noise suppression with the present method over the entire frequency range from the 1/f noise corner (approx. 30 KHz) to carrier frequency. Such close in noise suppression is not feasible or practical at high frequencies with phase locking or external filtering.

Figure 3:
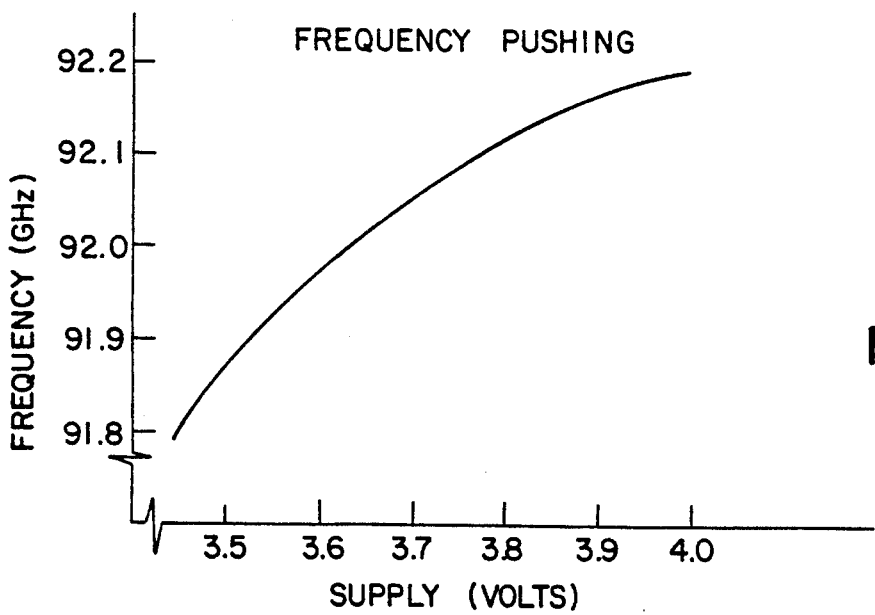
FIG. 3 is a graph showing frequency pushing.

It has also been reported, "How to Build a Gunn Oscillator", A. Sweet, *Microwave Associates Micronotes*-Vol. 11, #2, March 1974, that 1/f noise can be minimized by Gunn bias voltage adjustment to a region where the bias voltage-frequency characteristic (voltage-frequency pushing) is nearly flat (but not zero). However, this region often occurs near maximum safe bias voltage and is not a safe operating condition. If a zero pushing condition was reached by such bias voltage adjustment, maximum safe bias voltage would be exceeded. Hence, bias voltage adjustment into a nearly flat region can provide only partial 1/f noise suppression since a zero pushing condition, which is achieved in the disclosed 1/f noise suppression method, is required for maximum noise suppression. Furthermore, when Gunn bias voltage is adjusted for a nearly flat bias voltage-frequency characteristic, the bias point does not correspond with that for zero power pushing, the point of maximum output power with bias voltage. Oscillator performance characteristics for the conditions of zero power pushing and nearly flat frequency pushing are shown in FIGS. 2 and 3, "Millimeter Wave Oscillators and Impatt Power Supplies", *Plessey Microwave Electronics*, Product Catalog #6116, May 1984. A Gunn oscillator is normally operated just below the zero power pushing point to minimize the amplitude modulation (AM) noise of the oscillator. Bias voltage adjustment for minimum AM noise and minimum 1/f noise are therefore mutually exclusive since different values of bias voltage are required. In the present 1/f noise suppression method, the conditions for minimum AM noise and 1/f noise suppression are obtained by independent means. Therefore, the conditions for minimum AM noise and 1/f noise suppression can be met simultaneously.

Present Invention

The present 1/f noise suppression circuit does not use negative feedback, Gunn diode bias voltage adjustment or phase locking technology. It is based on establishing a zero voltage-frequency pushing condition at the desired oscillator frequency since oscillator frequency pushing is the controlling factor in 1/f noise generation in such active devices as a Gunn diode.

A lumped element circuit form is preferred to a distributed type circuit for implementation of the 1/f noise suppression circuit in a microwave and millimeter wave oscillator. A lumped element circuit introduces significantly less intra-circuit phase delay due to the short line lengths and small size of the discrete components that are used (approx. 1/10 wavelength), and is thereby more effective in suppression of 1/f noise. A 55 GHz lumped element Gunn oscillator circuit with 1/f noise suppression has a circuit area of 3/32×3/32 inches.

Figure 4:
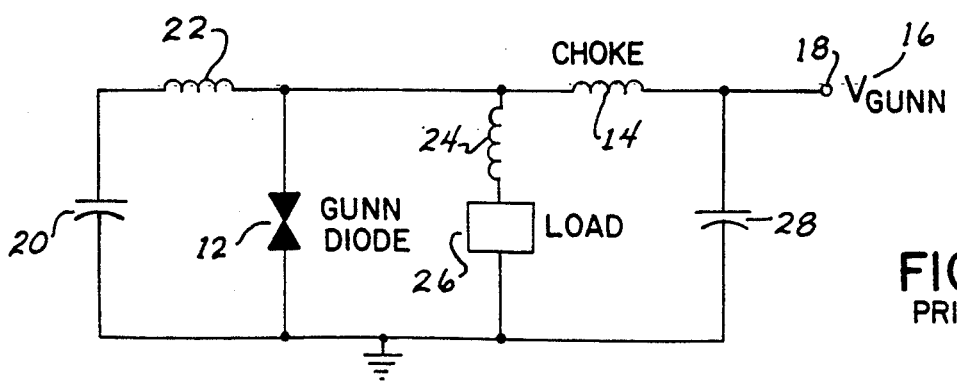
FIG. 4 is a circuit diagram showing an oscillator known in the prior art.

The circuit diagram and layout of a lumped element oscillator, without 1/f noise suppression circuit addition, is illustrated in FIGS. 4-6 for a 55 GHz oscillator. The active element is provided by Gunn diode 12 which is biased through quarter wave choke 14 from biasing voltage 16 at bias port 18. A fixed capacitor 20 is coupled to Gunn diode 12 through inductance 22. The oscillator output is provided through inductance 24 and coax transmission line 25 to load 26. Capacitor 28 is an RF bypass filter.

The circuit diagram and layout of a 55 GHz oscillator with the 1/f noise suppression circuit added is shown in FIGS. 7-9. The lumped element oscillator is based on the use of circuit elements that are sufficiently small (electrically) that they can be characterized as lumped components. The discrete circuit elements of the VCO shown in FIGS. 7-9 include three chip capacitors, 70, 82, 76, a chip varactor 56 and a packaged Gunn diode 64. A nonlinear varactor 56, such as an abrupt junction varactor rather than a linear type hyperabrupt junction varactor, is the preferred varactor type for a 1/f noise suppression application. The inductive elements 50, 94 are short lengths of line that provide the electrical connection between the discrete elements. The lines are sufficiently short that they constitute lumped elements. The exception is the Gunn diode and varactor diode bias chokes 44, 38 which are nominally quarter wavelength long at oscillator frequency.

The circuit in FIGS. 7-9 has a tuning port 30 receiving tuning voltage 32, and a biasing port 34 receiving biasing voltage 36. A first quarter wave choke 38 has a first terminal 40 connected to tuning port 30, and a second terminal 42. A second quarter wave choke 44 has a first terminal 46 connected to biasing port 34, and has a second terminal 48. An inductor 50 has a first terminal 52 connected to second terminal 42 of choke 38, and has a second terminal 54. A varactor 56 has a first terminal 58 connected to second terminal 54 of inductor 50, and has a second terminal 60 connected to node 62 which is connected to second terminal 48 of choke 44. The active element is provided by Gunn diode 64 having a first terminal 66 connected to node 62, and having a second terminal 68. A first capacitor 70 has a first terminal 72 connected to first terminal 40 of choke 38, and has a second terminal 74 connected to second terminal 68 of Gunn diode 64 through ground or reference connection 75. A second capacitor 76 has a first terminal 78 connected to first terminal 46 of choke 44, and has a second terminal 80 connected to second terminal 68 of Gunn diode 64 through ground connection 75. A third capacitor 82 has a first terminal 84 connected to second terminal 42 of choke 38, and has a second terminal 86 connected to second terminal 68 of Gunn diode 64 through ground connection 75. Capacitors 70, 76 and 82 are RF bypass filters. A fourth capacitor 88 may optionally be provided for trimming the slope of the tuning characteristic in establishing the zero oscillator pushing condition, to be described. Capacitor 88 is connected in parallel with varactor 56, and has a first terminal 90 connected to first terminal 58 of varactor 56, and has a second terminal 92 connected to second terminal 60 of varactor 56. An alternate arrangement to trim the slope of the tuning characteristic would be to eliminate the parallel trim provided by capacitor 88 and instead properly size capacitor 82 to provide a series trim. The oscillator output is provided through inductor 94 and coax transmission line 95 to load 96.

The circuit element 20 in FIG. 4 is a fixed capacitor which in combination with the reactive elements of the Gunn diode (package inductance, package capacitance and domain capacitance), inductances 22 and 24 and the output loading determine the frequency of oscillation of the oscillator. In the oscillator circuit with the added 1/f noise suppression circuit, FIG. 7, the fixed capacitor 20 of FIG. 4 is replaced with a varactor 56 and its associated bias circuit (quarter wave choke 38 and capacitors 70 and 82). The varactor is operated at a bias voltage that sets the varactor to the capacitance value that gives zero voltage-frequency pushing at the desired oscillator frequency. A common bias connection between varactor 56 and Gunn diode 64 is provided at node 62. The voltage across the varactor is determined by the sum of the voltage 32 and the voltage 36 appearing at node 62. Appropriate biasing of the varactor will permit selection of the desired varactor capacitance from the full capacitance range of the varactor.

At a fixed applied varactor bias, a change in Gunn bias will result in a change in varactor bias due to the common bias connection 62. For the arrangement described above, a decrease in Gunn positive bias voltage will result in an in-situ decrease of varactor reverse bias. This is the means by which a zero frequency pushing condition is established for the oscillator, and provides suppression of 1/f noise (see equations 7, 8). The oscillator in FIG. 7 is designed such that at the desired frequency of oscillation at rated Gunn diode bias, the frequency pushing characteristic (MHz/Volt), which normally has a negative slope, is totally compensated by the slope of the tuning characteristic which normally has a positive slope. Capacitor 88, if needed, is for trimming the slope of the tuning characteristic in establishing the zero pushing condition at the desired oscillator frequency.

Suppression of 1/f noise occurs as follows. A 1/f noise voltage perturbation of the bias voltage across the active region of the Gunn diode causes a random fluctuation in Gunn diode domain capacitance which would be manifest as carrier phase noise. However, establishment of a zero voltage-frequency pushing condition at Gunn diode operating bias results in oscillator insensitivity to voltage induced frequency changes and thereby suppresses the appearance of 1/f noise in the output spectrum of the oscillator in the presence of a 1/f noise voltage perturbation across the active region of the Gunn diode.

The establishment of the zero pushing condition in the oscillator in FIG. 7 is illustrated in FIG. 10. Curve 102 is representative of the tuning characteristic (frequency versus varactor voltage) of the oscillator at constant Gunn bias voltage. Curve 104 is the slope (positive) of the tuning characteristic (MHz/volt). Curve 106 is representative of the change in oscillator frequency with Gunn bias voltage with the varactor shown in FIG. 7 bias isolated (not shown) from the Gunn diode. Curve 108 is the slope (negative) of the frequency versus Gunn voltage characteristic and is known as the voltage-frequency pushing (MHz/volt) of the oscillator due to the active element. The net pushing of the oscillator, curve 110, with the varactor circuit connected as in FIG. 7, reflects the combined effect of the negative pushing characteristic (MHz/volts) associated with the Gunn diode itself and the positive tuning slope (MHz/volts) associated with the varactor tuned characteristic of the oscillator. The net oscillator pushing characteristic exhibits a point of zero pushing, at rated Gunn diode bias voltage $V_G$, and a specific varactor voltage $V_{VAR}$. At this operating point, an incremental change in Gunn bias voltage produces an in-situ change of equal magnitude in varactor voltage due to the common bias connection between the varactor and Gunn diode. An incremental change in Gunn bias voltage would cause an increase or decrease in oscillator frequency depending on the polarity of the bias voltage change. The in-situ change in varactor voltage would cause an equal change in oscillator frequency, but opposite in direction to that associated with the Gunn bias voltage change. These equal and opposite frequency determining effects compensate each other and result in a zero change in oscillator frequency with an incremental change in Gunn bias voltage, i.e. zero voltage-frequency pushing. At this operating point, oscillator performance is insensitive to Gunn bias voltage induced frequency changes. The oscillator will exhibit, for example, an insensitivity to frequency change from 1/f noise voltages across the active region of the Gunn diode and thereby provide suppression of 1/f noise components in the output frequency spectrum of the oscillator.

The measured frequency pushing performance of a varactor tuned microwave oscillator that exhibited zero pushing is shown in FIG. 11. The oscillator used the circuit configuration shown in FIG. 7. The data is a plot of percent pushing as a function of frequency, or equivalently, varactor voltage. Zero pushing occurred at 6.84 GHz. This performance demonstrates that the frequency pushing of the Gunn diode can be totally compensated with a varactor that provides a tuning characteristic of opposite slope to the pushing characteristic and thereby produces a net oscillator pushing of zero value. To suppress 1/f noise from appearing in the output spectrum of the oscillator at 6.84 GHz, the oscillator would be operated at rated Gunn voltage and at the varactor voltage corresponding to 6.84 GHz on its tuning characteristic.

The invention provides suppression of the flicker (1/f) noise that is normally exhibited by a Gunn oscillator in its output spectrum close to the carrier. Theory and experiment reported in the literature have shown that the voltage-frequency pushing of an oscillator is the controlling factor in 1/f noise generation. The means used to suppress the generation of 1/f noise in an oscillator is to make the pushing of the oscillator equal to zero by incorporating a varactor in the oscillator circuit to compensate for the oscillator pushing. Theory predicts that if the pushing of a Gunn oscillator is zero, 1/f noise will be eliminated from the output spectrum of the oscillator. Experimental data verifies that the condition of zero oscillator pushing can be achieved in the manner described. The predicted suppression of 1/f noise is 10 dB/decade at offset frequencies from the carrier that are less than the 1/f noise corner frequency (typically 30 KHz in a Gunn oscillator). Although the implementation of the 1/f noise suppression method has been described specifically for a Gunn oscillator, the suppression technique is general. It can be applied to oscillators using other active devices (e.g. Impatt diodes, FET's, bi-polar transistors) in which oscillator frequency pushing is a significant contributor to 1/f output noise. Sources with low 1/f noise would provide Doppler radars, sensors and communication systems with enhanced performance capabilities.

FIG. 12 is like FIG. 1, but with measured phase noise data added. The measured data shows that with the 1/f noise suppression circuit, the phase noise of the oscillator at offset frequencies less than the 20 KHz 1/f noise corner follows the white noise of the oscillator and does not show additive 1/f noise. If 1/f noise was present, the measured noise would have deviated from the straight line characteristic of the white noise and would have had an upward slope in the offset frequency region less than the 1/f noise corner. Without the 1/f noise suppression circuit, the phase noise below the 1/f noise corner would have followed the line marked "1/f noise (calc.)". Phase noise measurements at frequencies below 2 KHz were not made due to measurement equipment limitations.

VCO's have been built with both independent biasing of the Gunn and varactor diodes, and with a common bias connection, "Varactor Tuned Gunn Oscillators with Wide Tuning Range for the 25 to 75 GHz Frequency Band", Leonard D. Cohen, 1979 IEEE-MTT-S International Orlando, Florida. The function of the varactor is to provide electronic tunability to the oscillator. When a common bias connection is used in a VCO, it eliminates the need for a dc blocking capacitor that is required with independent biasing. This has the favorable effects of eliminating the loss of said capacitor and thereby providing higher output power, reducing the circuit parts count and reducing circuit parasitics. In the 1/f noise suppression circuit of the present invention, the varactor is used to reduce the pushing ($\Delta F/\Delta V_{Gunn}$) of the oscillator to zero and not for the conventional function of providing tunability over a broad frequency range as in a VCO. For the 1/f noise suppression circuit, a change in Gunn bias voltage provides an in-situ change in varactor voltage. The shape of the varactor capacitance versus voltage characteristic is made such that the combination of these voltage changes results in a zero change in oscillator frequency (zero voltage-frequency pushing). The varactor for this application has its capacitance-voltage characteristic appropriately shaped by use of trimming capacitor 88. The tuning slope of the oscillator provided by the varactor ($\Delta F/\Delta V_{Gunn}$) offsets the opposite tuning slope of the oscillator resulting from a change in Gunn diode bias voltage. This zero pushing condition for the oscillator will provide 1/f noise suppression as can be seen from equation 7. The final product is not a VCO as described in "Semi-Active Radar Guidance", A. Ivanov, *Microwave Journal*, September 1983, pp. 105–120, but is an oscillator with the uniqueness of suppressed 1/f noise at a specific frequency and in a small neighborhood thereof.

The invention provides a method and apparatus for reducing noise in an oscillator operational in the millimeter wave and microwave range by providing an active circuit including active element 64 with a negative resistance, and a resonator circuit 82, 50, 56 coupled to the active circuit and providing resonant circuitry in combination therewith. Flicker (1/f) noise is suppressed by reducing oscillator pushing to zero. As illustrated in FIGS. 1 and 12, the oscillator has increasing phase noise with decreasing offset frequency from a carrier frequency over a designated offset frequency range, including white noise above a given offset frequency 112 called the 1/f noise corner, and both white noise and flicker (1/f) noise below offset frequency 112. Flicker (1/f) noise is suppressed to provide only white noise below offset frequency 112, as shown in dashed line to the left of noise corner 112 in FIG. 1, and as shown in solid line in FIG. 12 for measured data. In the embodiment in FIG. 7, the resonator circuit is provided by a tuning circuit having a varactor 56 coupled to the active circuit and providing a varactor tuned oscillator, VCO. The VCO is operated as a fixed frequency oscillator at a given frequency providing zero oscillator pushing, to suppress flicker (1/f) noise. The circuit is not operated as a VCO. Varactor 56 is biased with a tuning voltage 32 setting the varactor to a capacitance value providing zero oscillator pushing at the given frequency. Node 62 provides a common bias connection between varactor 56 and active element 64. Active element 64 is biased with biasing voltage 36 and varactor 56 is biased with tuning voltage 32 such that the voltage across varactor 56 is provided by the sum of the tuning voltage 32 and the biasing voltage 36 which appears at common bias connection 62. An increase in voltage across active element 64 which causes an increase of active element capacitance and a decrease of oscillator frequency, also increases voltage across varactor 56 to decrease varactor capacitance and increase frequency to compensate said decrease of frequency, thereby reducing oscillator voltage-frequency pushing to zero and making the oscillator insensitive to Gunn bias voltage induced frequency changes. An increase in voltage across active element 64 due to random voltage fluctuations, otherwise causing flicker (1/f) noise, is inhibited from producing flicker (1/f) noise in the output frequency spectrum of the oscillator due to the insensitivity of the oscillator to frequency changes induced by voltage changes across active element 64 under the operating condition of zero voltage-frequency pushing. Flicker noise is thus suppressed by reducing oscillator pushing to zero by incorporating a varactor in the resonator circuit to compensate for oscillator pushing by the active circuit. The VCO is operated as a fixed frequency oscillator at a given frequency by applying a fixed tuning voltage 32 setting varactor 56 to a capacitance value providing zero oscillator pushing at the given frequency such that a random perturbation voltage change across active element 64 also causes a change in voltage across varactor 56, due to common bias connection 62, to compensate a change in oscillator frequency otherwise caused by such change in voltage across active element 64, to provide zero oscillator pushing, to suppress flicker (1/f) noise.

The varactor capacitance versus voltage characteristic 102, FIG. 10, is shaped such that a random perturbation voltage change across active element 64 also provides a change in varactor voltage such that the combination of these voltages results in zero change in oscillator frequency, to provide zero oscillator pushing, to provide a fixed frequency oscillator with suppressed flicker (1/f) noise at the given frequency. In preferred form, the active circuit and the tuning circuit are lumped element circuits. A flicker (1/f) noise voltage perturbation across the active element causes a random fluctuation in active element capacitance which would be manifest as carrier phase noise. However, the active element capacitance fluctuation is inhibited from otherwise causing flicker (1/f) noise in the output frequency spectrum of the oscillator by the in-situ and simultaneous compensating effect of varactor capacitance on active element capacitance fluctuation under the condition of zero pushing. The oscillator is provided with a varactor frequency versus voltage characteristic 102, FIG. 10, having a slope 104, and with an active element frequency versus voltage characteristic 106 having a slope 108. Slopes 104 and 108 compensate each other at the given frequency and provide zero oscillator pushing as shown at point 114 on net oscillator pushing curve 110 which is the sum of slopes 104 and 108. Negative slope 108 is equal and opposite to positive slope 104 at point 114, to reduce net oscillator pushing to zero to suppress flicker (1/f) noise.

It is recognized that various equivalents, alternatives and modifications are possible within the scope of the appended claims.

I claim:

1. A method for reducing noise in an oscillator operational in the millimeter wave and microwave range, comprising providing an active circuit including an active element with a negative resistance, providing a resonator circuit coupled to said active circuit and providing resonant circuitry in combination therewith, suppressing flicker (1/f) noise by reducing oscillator pushing to zero.

2. The method according to claim 1 wherein said oscillator has increasing phase noise with decreasing offset frequency from a carrier frequency over a designated offset frequency range, including white noise above a given offset frequency, and both white noise and flicker (1/f) noise below said given offset frequency, and suppressing said flicker (1/f) noise to provide only white noise below said given offset frequency.

3. A method for reducing noise in an oscillator operational in the millimeter wave and microwave range, comprising providing a varactor tuned oscillator, VCO, comprising an active circuit having an active element with a negative resistance, and a tuning circuit having a varactor coupled to said active circuit and providing resonant circuitry in combination therewith, operating said VCO as a fixed frequency oscillator at a given frequency providing zero oscillator pushing, to suppress flicker (1/f) noise.

4. The method according to claim 3 comprising biasing said varactor with a tuning voltage setting the varactor to a capacitance value providing zero oscillator pushing at said given frequency.

5. The method according to claim 4 comprising providing a common bias connection between said varactor and said active element, and biasing said active element with a biasing voltage and biasing said varactor with said tuning voltage such that the voltage across said varactor is provided by the sum of said tuning voltage and said biasing voltage at said common bias connection and such that an increase in voltage across said active element causing an increase of active element capacitance and a decrease of oscillator frequency, also increases voltage across said varactor to decrease varactor capacitance and increase frequency to compensate said decrease of frequency, thereby causing the oscillator to have zero voltage-frequency pushing whereby said oscillator is insensitive to frequency fluctuations cross said active element, otherwise causing flicker (1f) noise in the output frequencY spectrum of the oscillator.

6. A method for reducing noise in an oscillator operational in the millimeter wave and microwave range, comprising providing an active circuit including an active element with a negative resistance, providing a resonator circuit coupled to said active circuit and providing resonant circuitry in combination therewith, suppressing flicker noise by reducing oscillator pushing to zero by incorporating a varactor in said resonator circuit to compensate for oscillator pushing by said active circuit.

7. The method according to claim 6 comprising biasing said varactor with a selected tuning voltage setting the varactor to a capacitance value providing zero oscillator pushing at a given frequency, and operating said oscillator as a fixed frequency oscillator at said given frequency.

8. The method according to claim 7 comprising shaping the varactor capacitance versus voltage characteristic such that a random perturbation voltage change across said active element also provides a change in varactor voltage such that the combination of these voltages results in zero change in oscillator frequency, to provide said zero oscillator pushing, to provide a fixed frequency oscillator with suppressed flicker (1/f) noise at said given frequency.

9. A method for reducing noise in an oscillator operational in the millimeter wave and microwave range, comprising providing a varactor tuned oscillator, VCO, comprising an active circuit having an active element with a negative resistance, and a tuning circuit having a varactor coupled to said active element by a common bias connection therebetween and providing resonant circuitry in combination therewith, biasing said active element with a biasing voltage, biasing said varactor with a tuning voltage, operating said VCO as a fixed frequency oscillator at a given frequency by applying a fixed said tuning voltage setting said varactor to a capacitance value providing zero oscillator pushing at said given frequency such that a random perturbation voltage change across said active element also causes a change in voltage across said varactor, due to said common bias connection, to compensate a change in oscillator frequency otherwise caused by said change in voltage across said active element, to provide zero oscillator pushing, to suppress flicker (1/f) noise.

10. The method according to claim 9 comprising providing lumped element said active and tuning circuits, and wherein a flicker (1/f) noise voltage perturbation across said active element causes a random fluctuation in active element capacitance which would be manifest as carrier phase noise, and wherein said active element capacitance fluctuation is inhibited from otherwise causing flicker (1/f) noise in the output spectrum of the oscillator by the in-situ and simultaneous compensating effect of varactor capacitance on active element capacitance fluctuation under the condition of zero pushing.

11. A method for reducing noise in an oscillator operational in the millimeter wave and microwave range, comprising providing an active circuit including an active element with a negative resistance, providing a resonator circuit coupled to said active circuit and providing resonant circuitry in combination therewith, suppressing flicker (1/f) noise by reducing oscillator pushing to zero by incorporating a varactor in said resonator circuit to compensate for oscillator pushing by said active circuit, biasing said varactor with a selected tuning voltage setting the varactor to a capacitance value providing zero oscillator pushing at a given frequency, providing said oscillator with a varactor frequency versus voltage characteristic having a first slope at said given frequency, providing said oscillator with an active element frequency versus voltage characteristic having a second slope at said given frequency, wherein said first and second slopes compensate each other at said given frequency and provide zero oscillator pushing.

12. The method according to claim 11 wherein said first and second slopes are equal and opposite at said given frequency.

13. A method for suppressing flicker (1/f) noise in an oscillator operational in the millimeter wave and microwave range, comprising providing an active circuit including an active element with a negative resistance and having a frequency versus voltage characteristic with a negative slope, providing a tuning circuit having a frequency versus voltage characteristic with a positive slope and coupled to said active circuit and providing resonant circuitry in combination therewith, biasing said active circuit and said tuning circuit such that said negative slope and said positive slope are equal and opposite and compensate each other to reduce oscillator pushing to zero to suppress flicker (1/f) noise.

14. The method according to claim 13 comprising providing said tuning circuit with a varactor to provide a varactor tuned said oscillator, VCO, operating said VCO as a fixed frequency oscillator at a given frequency providing said zero oscillator pushing at said given frequency, trimming said positive slope of said tuning circuit characteristic with a capacitor connected in parallel with said varactor, to establish said zero pushing at said given frequency.

15. An oscillator with reduced noise and operational in the millimeter wave and microwave range, comprising an active circuit including an active element with a negative resistance, a resonator circuit coupled to said active circuit and providing resonant circuitry in combination therewith, means in combination with said active circuit and said resonator circuit suppressing flicker (1/f) noise by reducing oscillator pushing to zero.

16. The invention according to claim 15 wherein said oscillator has increasing phase noise with decreasing offset frequency from a carrier frequency over a designated offset frequency range, including white noise above a given offset frequency, and both white noise and flicker (1/f) noise below said given offset frequency, and wherein said means reducing oscillator pushing to zero suppresses said flicker (1/f) noise to provide only white noise below said given offset frequency.

17. An oscillator with reduced noise and operational in the millimeter wave and microwave range, comprising a varactor tuned oscillator, VCO, comprising an active circuit having an active element with a negative resistance, a tuning circuit having a varactor coupled to said active circuit and providing resonant circuitry in combination therewith, means operating said VCO as a fixed frequency oscillator at a given frequency providing zero oscillator pushing, to suppress flicker (1/f) noise.

18. The invention according to claim 17 comprising means biasing said varactor with a tuning voltage setting the varactor to a capacitance value providing zero oscillator pushing at said given frequency.

19. The invention according to claim 18 wherein said varactor and said active element are connected by a common bias connection therebetween, said active element is biased with a biasing voltage, said varactor is biased with a tuning voltage such that the voltage across said varactor is provided by the sum of said tuning voltage and said biasing voltage at said common bias connection such that an increase in voltage across said active element causes an increase of active element capacitance and a decrease of oscillator frequency, also increases voltage across said varactor to decrease varactor capacitance and increase frequency to compensate said decrease of frequency, thereby reducing oscillator pushing to zero to suppress flicker (1/f) noise in the output frequency spectrum of the oscillator otherwise caused by random flicker (1/f) noise voltage fluctuations across the active element.

20. An oscillator with reduced noise and operational in the millimeter wave and microwave range, comprising an active circuit including an active element with a negative resistance, a resonator circuit coupled to said active circuit and providing resonant circuitry in combination therewith, a varactor in said resonator circuit compensating for oscillator pushing by said active circuit, to reduce oscillator pushing to zero, to suppress flicker (1/f) noise.

21. The invention according to claim 20 comprising means biasing said varactor with a selected tuning voltage setting the varactor to a capacitance value providing zero oscillator pushing at a given frequency and such that said oscillator is a fixed frequency oscillator at said given frequency.

22. The invention according to claim 21 wherein said varactor has a capacitance versus voltage characteristic shaped such that a random perturbation voltage change across said active element also provides a change in varactor voltage such that the combination of these voltage changes results in zero change in oscillator frequency, to provide said zero oscillator pushing, to provide a fixed frequency oscillator with suppressed flicker (1/f) noise at said given frequency.

23. An oscillator with reduced noise and operational in the millimeter wave and microwave range, comprising a varactor tuned oscillator, VCO, comprising an active circuit having an active element with a negative resistance, a tuning circuit having a varactor coupled to said active element by a bias connection therebetween and providing resonant circuitry in combination therewith, means biasing said active element with a biasing voltage, means biasing said varactor with a fixed tuning voltage operating said VCO as a fixed frequency oscillator at a given frequency and setting said varactor to a capacitance value providing zero oscillator pushing at said given frequency such that a random perturbation voltage change across said active element also causes a change in voltage across said varactor, due to said common bias connection, to compensate a change in oscillator frequency otherwise caused by said change in said voltage across said active element, to provide said zero oscillator pushing, to suppress flicker (1/f) noise.

24. The invention according to claim 23 wherein said active circuit and said tuning circuit are lumped element circuits, and wherein a flicker (1/f) noise voltage perturbation across said active element causes a random fluctuation in active element capacitance which would be manifest as carrier phase noise, and wherein said active element capacitance fluctuation is inhibited from otherwise causing flicker (1/f) noise in the output spectrum of the oscillator by the in-situ and simultaneous compensating effect of varactor capacitance on active element capacitance fluctuation under the condition of zero pushing.

25. An oscillator with reduced noise and operational in the millimeter wave and microwave range, comprising an active circuit including an active element with a negative resistance, a resonator circuit coupled to said active circuit and providing resonant circuitry in combination therewith, a varactor in said resonator circuit compensating oscillator pushing by said active circuit to reduce oscillator pushing to zero, means biasing said varactor with a selected tuning voltage setting the varactor to a capacitance value providing zero oscillator pushing at a given frequency, wherein said varactor has a frequency versus voltage characteristic having a first slope at said given frequency, said active element has a frequency versus voltage characteristic having a second slope at said given frequency, wherein said first and second slopes compensate each other at said given frequency and provide zero oscillator pushing.

26. The invention according to claim 25 wherein said first and second slopes are equal and opposite at said given frequency.

27. An oscillator with suppressed flicker (1/f) noise and operational in the millimeter wave and microwave range, comprising an active circuit including an active element with a negative resistance and having a frequency versus voltage characteristic with a negative slope, a tuning circuit having a frequency versus voltage characteristic with a positive slope and coupled to said active circuit and providing resonant circuitry in combination therewith, means biasing said active circuit and said tuning circuit such that said negative slope and said positive slope are equal and opposite and compensate each other to reduce oscillator pushing to zero to suppress flicker (1/f) noise.

28. The invention according to claim 27 wherein said tuning circuit includes a varactor biased at a fixed tuning voltage to provide a varactor tuned said oscillator, VCO, operated as a fixed frequency oscillator at a given frequency providing said zero oscillator pushing at said given frequency, and comprising a capacitor connected in parallel with said varactor and trimming said positive slope of said tuning circuit characteristic to establish said zero pushing at said given frequency.

29. The invention according to claim 27 comprising:
a first bias port for biasing said varactor;
a second bias port for biasing said active element;
a first quarter wave choke having first and second terminals, said first terminal of said first choke being coupled to said first bias port;
a second quarter wave choke having first and second terminals, said first terminal of said second choke being coupled to said second bias port;
an inductance having first and second terminals, said first terminal of said inductance being coupled to said second terminal of said first choke;
a varactor having first and second terminals, said first terminal of said varactor being coupled to said second terminal of said inductance, said second terminal of said varactor being coupled at a node to said second terminal of said second choke;
said active element having first and second terminals, said first terminal of said active element being coupled to said second terminal of said varactor at said node and being coupled to said second terminal of said second choke at said node;
a first capacitor having first and second terminals, said first terminal of said first capacitor being coupled to said first terminal of said first choke, said second terminal of said first capacitor being coupled to said second terminal of said active element;
a second capacitor having first and second terminals, said first terminal of said second capacitor being coupled to said first terminal of said second choke, said second terminal of said second capacitor being coupled to said second terminal of said active element;
a third capacitor having first and second terminals, said first terminal of said third capacitor being coupled to said second terminal of said first choke, said second terminal of said third capacitor being coupled to said second terminal of said active element,
said node providing a common bias connection between said varactor and said active element such that the voltage across said varactor is provided by the sum of the voltages from said first and second bias ports, and such that a random perturbation voltage change across said active element also provides a change in varactor voltage such that the combination of these voltage changes results in zero change in oscillator frequency, to provide said zero oscillator pushing.

30. The invention according to claim 29 comprising a fourth capacitor having first and second terminals, said first terminal of said fourth capacitor being coupled to said first terminal of said varactor, said second terminal of said fourth capacitor being coupled to said second terminal of said varactor, said fourth capacitor trimming said positive slope of said tuning circuit characteristic to establish said zero pushing.

* * * * *